Figure 1:
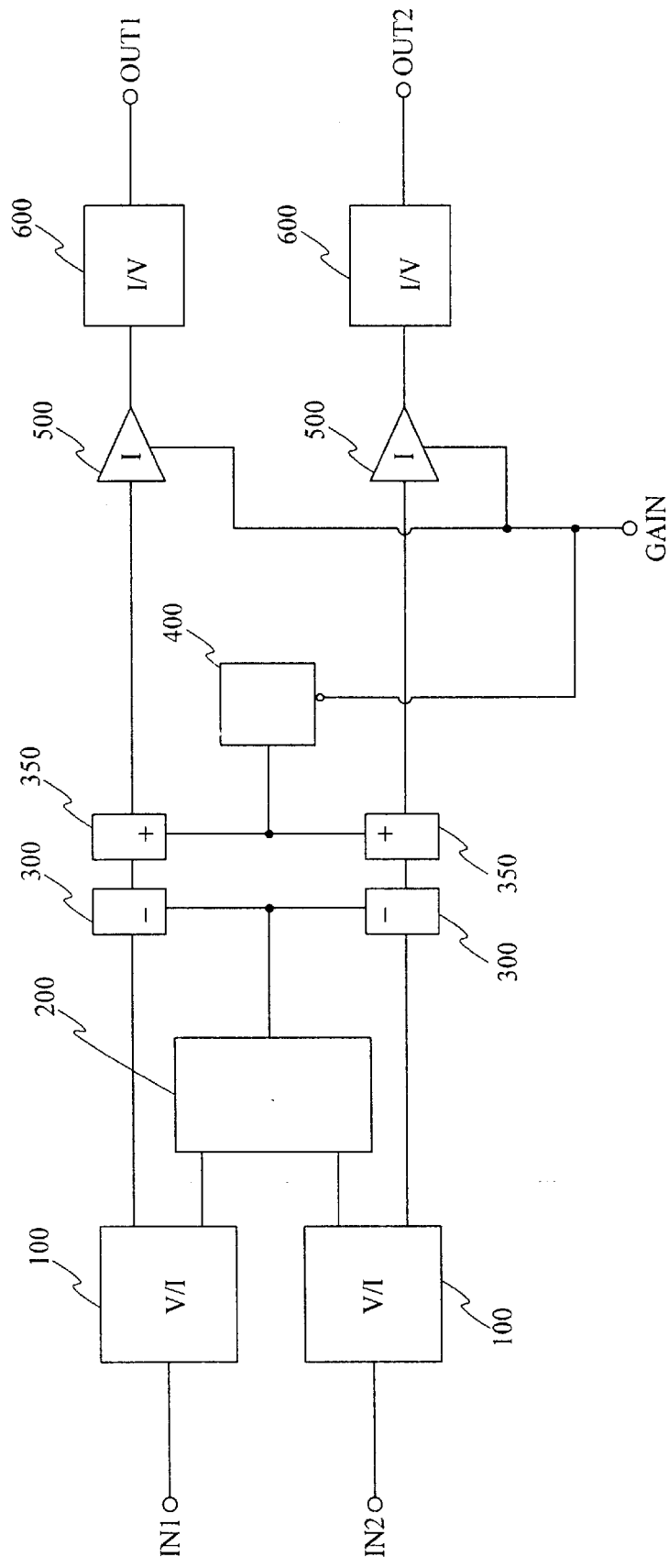

United States Patent [19]
Manninen et al.

[11] Patent Number: 6,121,830
[45] Date of Patent: Sep. 19, 2000

[54] REGULATING THE GAIN OF A CIRCUIT INCLUDING A PROGRAMMABLE CURRENT AMPLIFIER USING A CONTROL SIGNAL

[75] Inventors: Hannu Manninen, Espoo; Mika Tiilikainen, Helsinki, both of Finland

[73] Assignee: Nokia Mobile Phones, Ltd., Espoo, Finland

[21] Appl. No.: 09/063,833

[22] Filed: Apr. 21, 1998

[30]      Foreign Application Priority Data

Apr. 22, 1997  [FI]  Finland ..................................... 971707

[51] Int. Cl.[7] ........................................................ H03F 1/02
[52] U.S. Cl. .................................. 330/9; 330/69; 330/258; 327/307
[58] Field of Search ............................. 327/307; 330/9, 330/69, 258

[56]           References Cited

U.S. PATENT DOCUMENTS

| | | | |
|---|---|---|---|
| 5,233,634 | 8/1993 | Vaisanen | 375/98 |
| 5,329,191 | 7/1994 | Korhonen et al. | 307/540 |
| 5,331,638 | 7/1994 | Honkasalo et al. | 370/95.1 |
| 5,557,639 | 9/1996 | Heikkila et al. | 375/224 |
| 5,596,677 | 1/1997 | Jarvinen et al. | 395/2.29 |
| 5,841,318 | 11/1998 | Cram | 330/69 |

FOREIGN PATENT DOCUMENTS

| | | |
|---|---|---|
| 0 639 889 A1 | 2/1995 | European Pat. Off. . |
| 0 641 069 A1 | 3/1995 | European Pat. Off. . |
| 0 649 218 A1 | 4/1995 | European Pat. Off. . |
| 0 690 564 A1 | 1/1996 | European Pat. Off. . |
| 0 718 968 A1 | 6/1996 | European Pat. Off. . |
| WO 95/32548 | 11/1995 | WIPO . |
| WO 95/35595 | 12/1995 | WIPO . |

*Primary Examiner*—Michael B. Shingleton
*Attorney, Agent, or Firm*—Perman & Green, LLP

[57]           ABSTRACT

The invention relates to programmable amplifiers, more specifically to structural solutions of amplifiers realised on integrated circuits. In the amplifier according to the invention a differential voltage-mode input signal is converted into a differential current signal and at least part of the common-mode component is removed from the differential current signal. An offset current is added to the differential current signal and the magnitude of the offset current is adjusted according to the gain, thus preventing the common-mode current from becoming too large at the amplification stage. The differential current signal is amplified using programmable current amplifiers realised by current mirrors and converted back into a voltage-mode signal.

13 Claims, 6 Drawing Sheets

REGULATING THE GAIN OF A CIRCUIT INCLUDING A PROGRAMMABLE CURRENT AMPLIFIER USING A CONTROL SIGNAL

The invention relates to programmable amplifiers, more specifically to structural solutions for amplifiers implemented on integrated circuits. Programmable amplifiers are used e.g. in portable mobile communications devices where programmability is used in an attempt to compensate for the variation of microphone sensitivity that occurs in series production. In such apparatuses a minimal current consumption and minimal size are essential features of components.

Integrated programmable amplifiers are typically based on programmable feedback networks implemented with resistors, and on operational amplifiers. Common mode rejection is often realised using a dedicated feedback circuit. If there are several programmable functions, such as different gain values for the amplifier, the number of resistors usually becomes high if the practically realisable binary combinations cannot be used, which means the amplifier needs more silicon area. High-quality resistor materials have low sheet resistances and thus require considerably area. To realise high resistor values it is often necessary to use high-resistive materials lest the area become too big. Such solutions often lead to linearity problems because the resistor materials used are typically non-linear, or alternatively a more complex linear resistor process has to be applied. A high number of resistors also increases noise.

Programmable amplifiers can also be realised by means of current amplifiers, in which case gain can be adjusted using various scaled current mirror constructions. Such constructions are disclosed e.g. in the PCT application document WO95/32548. The solutions described in said document have, however, the problem that they are based on the use of a dual-polarity supply. Small portable devices often do not have a dual-polarity supply available, so the transfer of a signal in current mode requires an offset current to which the signal is added. The use of an offset current, however, increases current consumption especially at high gains as the current-mode amplifier stage amplifies not only the signal current but also the offset current.

It is an object of this invention to provide an amplifier structure that can be integrated into a very small space. It is also an object of this invention to provide a programmable amplifier the implementation of which requires as few resistors as possible. It is still another object of this invention to provide an amplifier structure suitable for the CMOS process. It is a further object of this invention to provide a programmable current amplifier operating at low operating voltages. It is yet another object of this invention to provide a current amplifier structure that can be implemented using digital processes that are cheaper than analog ones and that have no linear resistors available.

The objects are achieved by realising the amplifier using current amplifiers formed by scaled current mirrors, and by making the offset current inversely regulated with respect to the gain of the current amplifiers so that the offset current is small when the signal is small and the gain big, and big when the signal is big and the gain small.

The amplifier circuit according to the invention is characterised in that it comprises an offset current generating means and a summing means which is arranged to add an offset current to the current signal, said offset current generating means being such that it is arranged to generate an offset current according to the value of a certain control signal in inverse proportion to the gain of said current amplifier such that in response to a change in said control signal which causes the gain of said current amplifier to increase, the offset current generated by the offset current generating means decreases, and in response to a change in said control signal which causes the gain of said current amplifier to decrease, the offset current generated by the offset current generating means increases.

The mobile communications device according to the invention is characterised in that it comprises a programmable current amplifier circuit which comprises an offset current generating means and a summing means which is arranged to add an offset current to the current signal, said offset current generating means being such that it is arranged to generate an offset current according to the value of a certain control signal in inverse proportion to the gain of said current amplifier such that in response to a change in said control signal which causes the gain of said current amplifier to increase, the offset current generated by the offset current generating means decreases, and in response to a change in said control signal which causes the gain of said current amplifier to decrease, the offset current generated by the offset current generating means increases.

The method according to the invention is characterised in that in the method, when the gain of the current amplifier circuit is increased, the gain of the at least one programmable current amplifier is increased, and the amplification of the reference current is decreased in the means for generating an offset current; and when the gain of the current amplifier circuit is decreased, the gain of the at least one programmable current amplifier is decreased, and the amplification of the reference current is increased in the means for generating an offset current.

In the amplifier according to the invention a voltage-mode input signal is converted to a differential current signal, and at least part of the common-mode component is removed from the differential current signal. An offset current is added to the differential current signal, the magnitude of said offset current being regulated according to the gain, thus preventing the common-mode current from growing too large in the amplification stage. The differential current signal is amplified using programmable current amplifiers implemented with current mirrors. The output signal can be converted back to the voltage mode or left in the current mode, depending on the application. A current-mode output signal is advantageous if, for example, the input of the block following the amplifier structure according to the invention is in the current mode, too.

Figure 2:
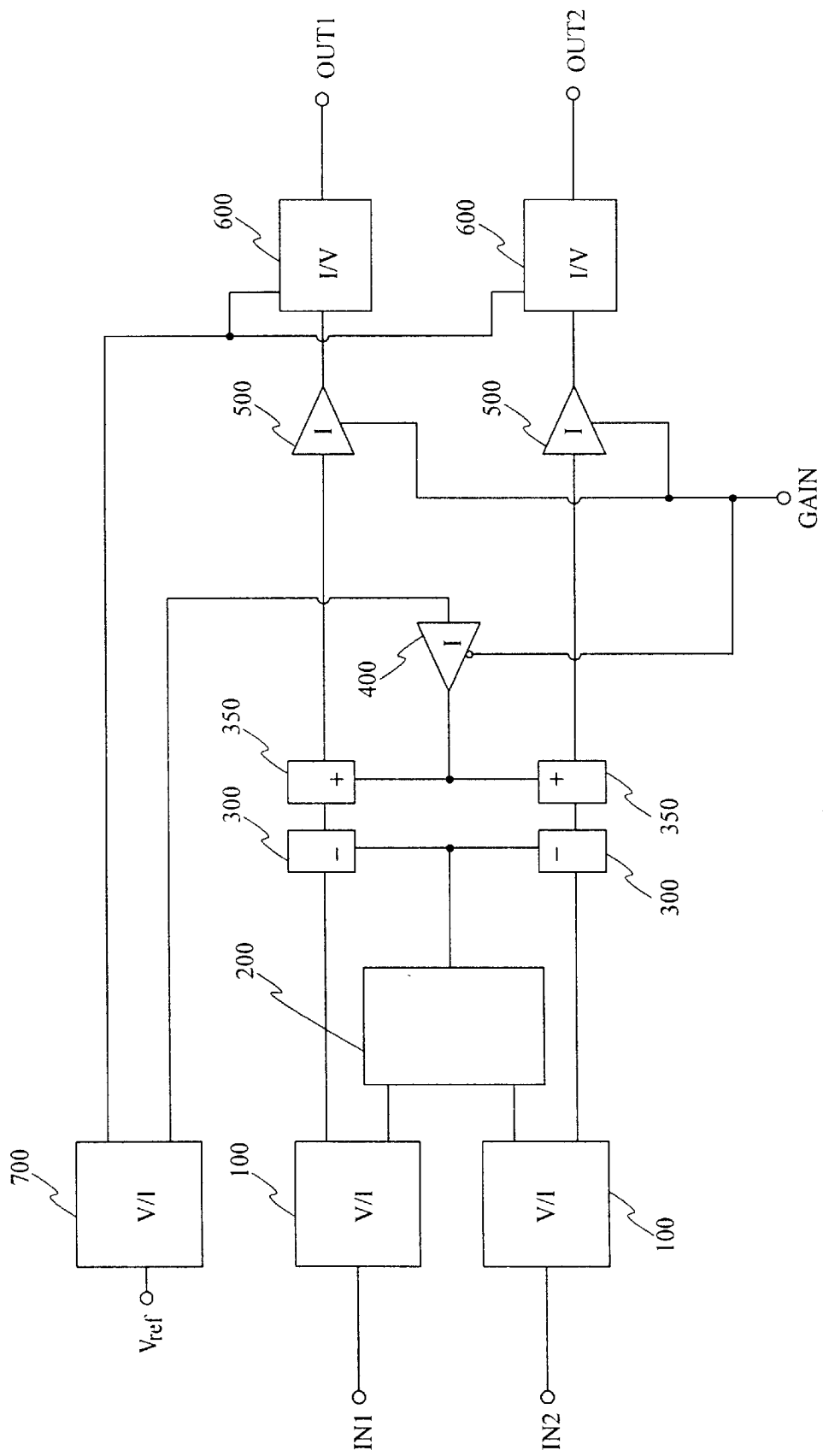
Figure 3:
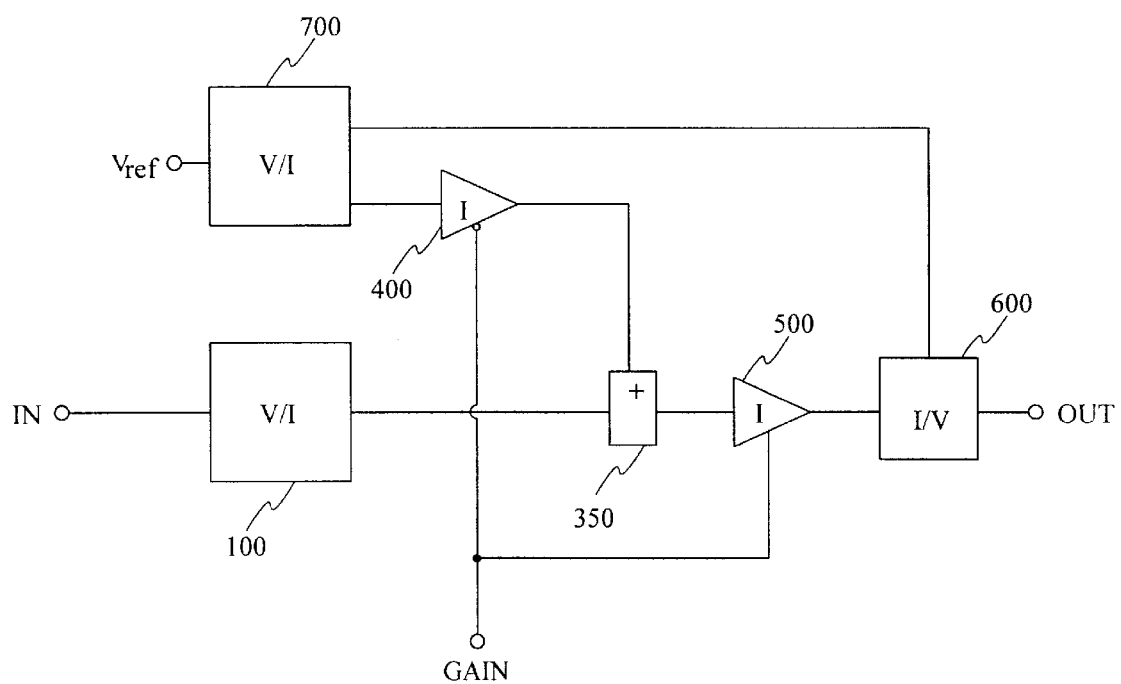
Figure 4:
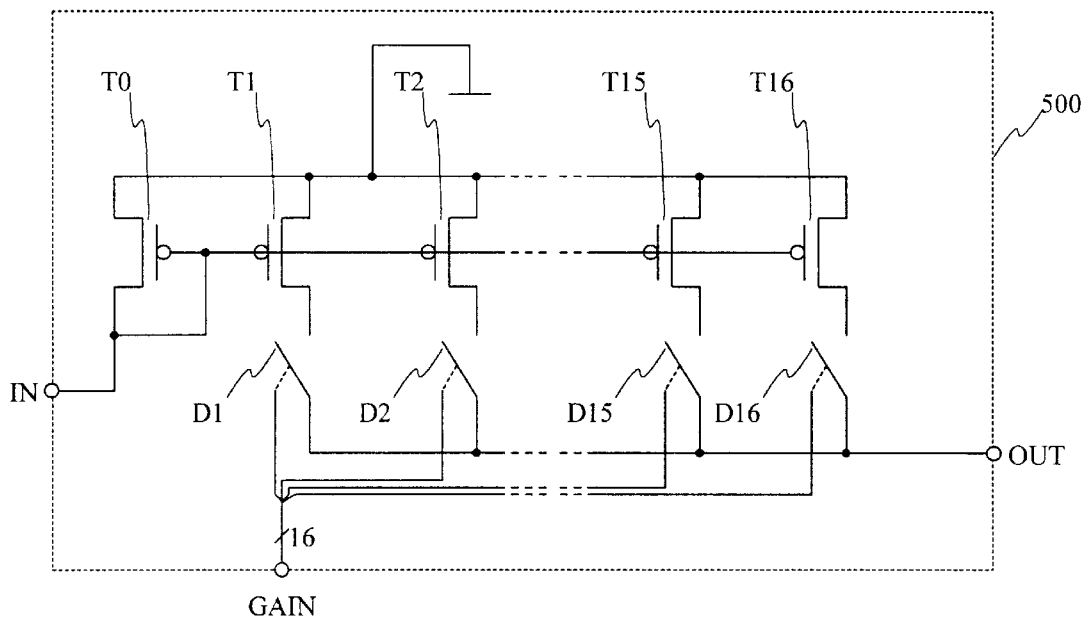
Figure 5:
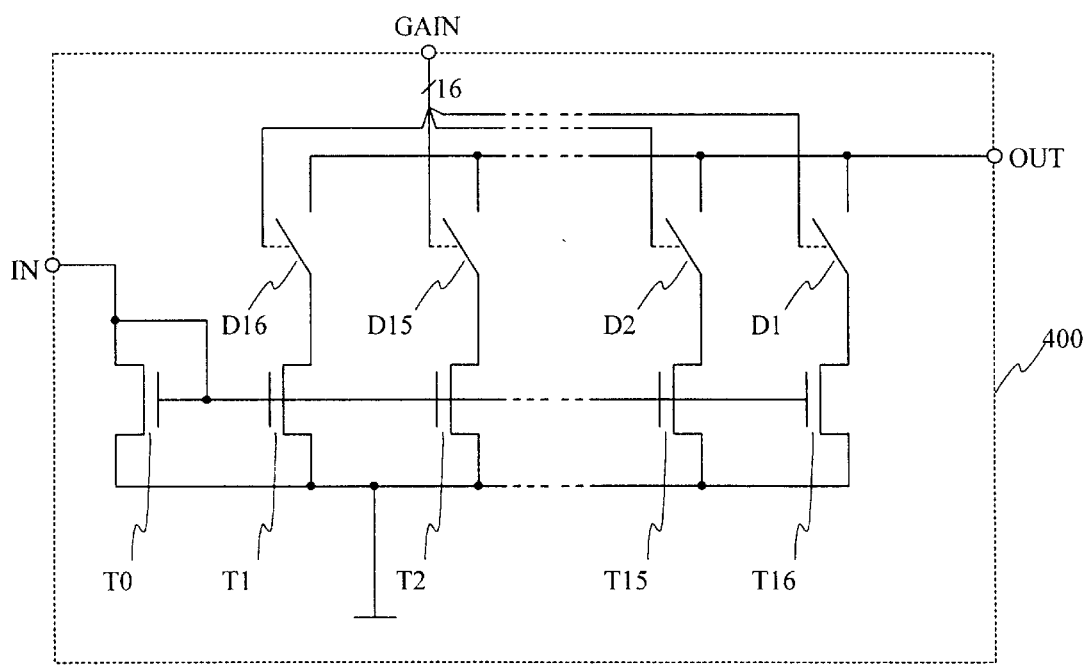
Figure 6:
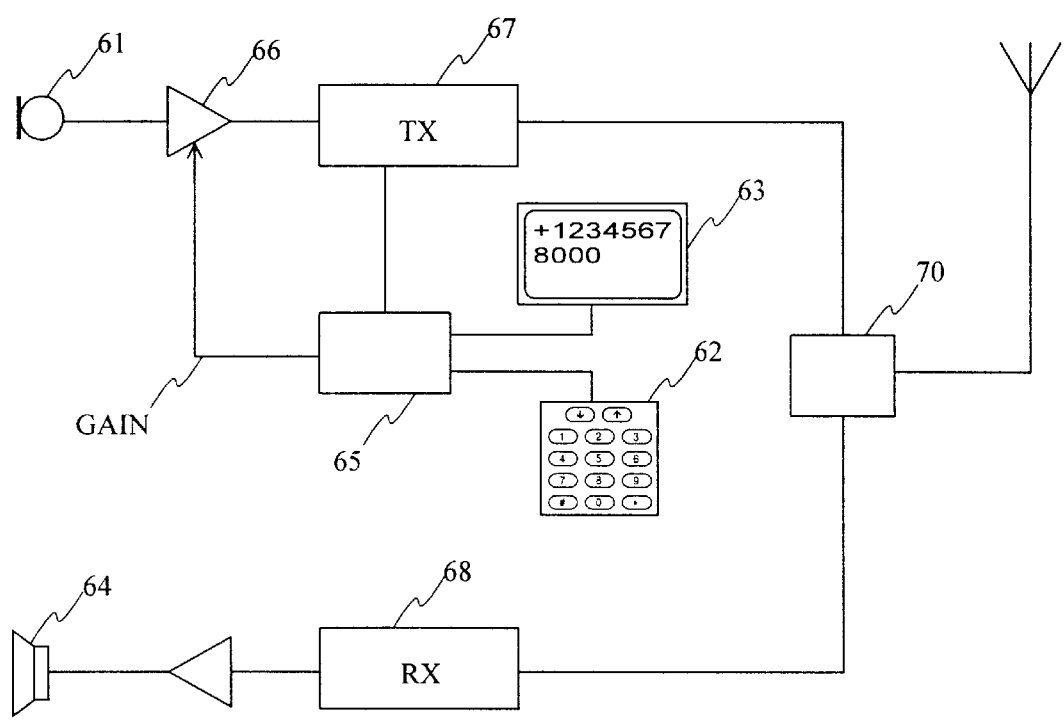
Figure 7:
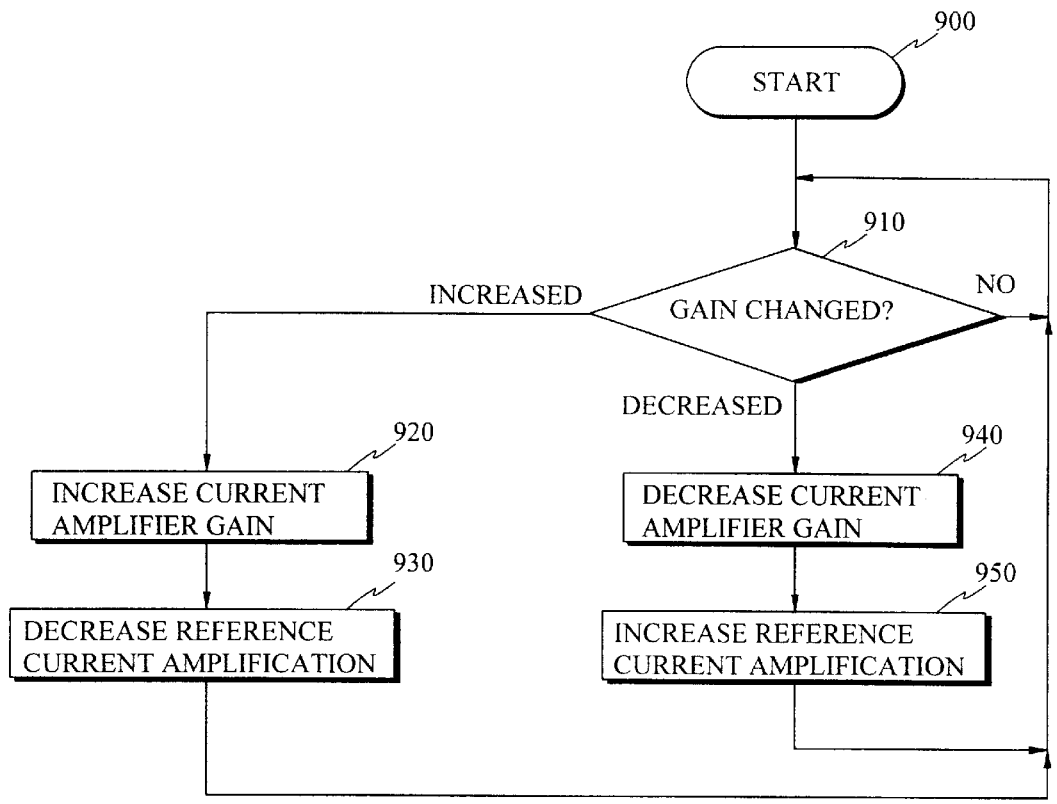
Figure 8:
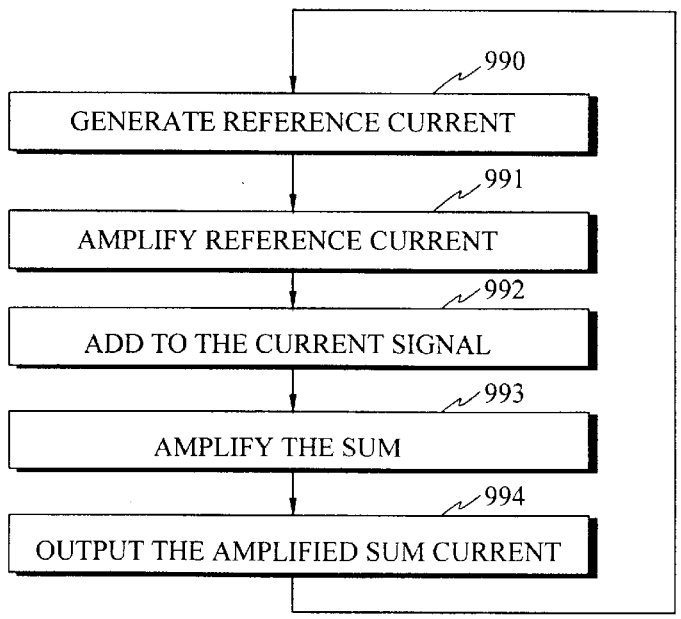

The invention is described in more detail with reference to the preferred embodiments presented by way of example and to the accompanying drawings where FIG. 1 shows a block diagram of a preferred embodiment of the invention, FIG. 2 shows a block diagram of a second preferred embodiment of the invention, FIG. 3 shows a block diagram of a third preferred embodiment of the invention, FIG. 4 shows a possible structure of a programmable current amplifier 500, FIG. 5 shows a possible structure of an offset current generating means 400, FIG. 6 shows an exemplary application of the invention, FIG. 7 shows an example of a method according to an advantageous embodiment of the invention, and FIG. 8 shows an example of a method according to an advantageous embodiment of the invention.

Like means in the drawings are denoted by like reference designators.

FIG. 1 shows a block diagram of a preferred embodiment of the invention. The input voltages of both inputs IN1, IN2 are first converted into the current mode at voltage-to-current converters 100. In this embodiment, the voltage-to-current converters 100 have two current-mode outputs the signal of the first of which is taken to a common-mode signal generating means 200 and the signal of the second of which is taken to the next means on the amplifier signal path. The common-mode signal generating means 200 extracts from the input signals the common-mode part which is taken to subtracting means 300. The subtracting means 300 subtract said parts of the divided signal from the current signals of the other outputs of the voltage-to-current converters, i.e. from the current signal of the current path. Summing means 350 add to the current signals of the signal path an offset current produced by an offset current generating means 400. The summing means 350 may be simple wire connections, for example.

From the summing means 350 the current signals of the signal path are directed to programmable current amplifiers 500. If a programmable current amplifier has a certain minimum gain, say, 20 dB, such minimum gain can be preferably realised in conjunction with the voltage-to-current conversion so that the current-mode outputs of the voltage-to-current converter 100 have already been amplified to the extent of the minimum gain. Placing the amplification stage as close to the amplifier input as possible reduces the amplifier's noise level. Current-to-voltage converters 600 convert the amplified current signals into amplifier output voltages OUT1, OUT2.

The offset current generating means 400 and current amplifiers 500 are advantageously controlled by the same control signal GAIN. However, the operation of the offset current generating means 400 as the function of the control signal GAIN is the reverse of the operation of the current amplifiers 500: when the gain of the current amplifiers increases as a result of a change in the control signal GAIN the offset current generating means 400 reduces the offset current, and when the gain of the current amplifiers decreases as a result of a change in the control signal GAIN the offset current generating means 400 raises the offset current. This way, the offset current is small when the input signal is small, thus avoiding extra current consumption caused by an unnecessarily large offset current.

Below it is described in greater detail examples of different alternative implementations of functional blocks in various embodiments of the invention.

The voltage-to-current converters 100 can be advantageously realised using current mirrors. In such an embodiment each one of the input voltages IN1, IN2 is converted by means of a resistor into a current that is mirrored by a current mirror to the output of the voltage-to-current converter. The possibly required minimum gain can also be realised by means of a current mirror.

In a preferred embodiment of the invention the common-mode signal is removed from the output signals of the voltage-to-current converters 100 using a method known as the common mode feed forward (CMFF) known to one skilled in the art. In such an embodiment the common-mode signal can be removed already at the voltage-to-current converters such that the voltage-to-current converters 100, the common-mode signal generating means 200 and the subtracting means 300 constitute one combined functional block.

The current amplifiers 500 are advantageously identical in construction. The current amplifiers 500 can be advantageously realised using current mirror constructions so that the programmable gain can be realised by selecting by means of switching transistors scaled transistors as the amplifier's output transistors. In such an embodiment the control signal GAIN is digital and may comprise more than one control line corresponding to one bit, depending on the number of scaled output transistors selectable in one amplifier. In addition, a current mirror construction may be realised such that the gates of the output transistors are interconnected whereby the parasitic gate capacitance stays constant independent of the gain. In such an embodiment the gate capacitance can be applied in restricting the amplifier's bandwidth.

Current mirror constructions can be used to easily realise variable-sized gain regulating steps such as logarithmic steps that are difficult to implement using conventional methods. The programmable current amplifiers 500 and possible current amplifier of the offset current generating means 400 can be implemented with one or more amplifier stages. Let us consider, for example, a two-stage amplifier the gain of which is adjustable within the range of 0 to 42.5 dB. Such an amplifier can be realised with two amplifier stages, the first having a gain of either 0 dB or 20 dB, and the second having a gain of, say, 0 to 22.5 dB in 1.5-dB steps, for example. From the noise standpoint it is preferable to implement the first amplifier stage at the voltage-to-current converters 100 and the second amplifier stage at the programmable current amplifiers 500. The combined effect of these amplifier stages is that the gain of such a two-stage amplifier is adjustable in the 0 to 42.5 dB range in steps of 1.5 dB.

In a preferred embodiment of the invention the offset current generating means 400 comprises a programmable amplifier like the current amplifiers 500 which generates a desired offset current by amplifying a certain fixed constant current. This current amplifier in the offset current generating means 400 can be realised e.g. such that it responds to the control signal GAIN in an inverse manner as compared to the current amplifiers 500.

In a second preferred embodiment of the invention the offset current generating means 400 comprises a programmable amplifier substantially like the current amplifiers 500 which generates a desired offset current by amplifying a certain fixed constant current, and a conversion means for the control signal GAIN, connected so as to control the current amplifier of the offset current generating means and inverting the control signal GAIN, whereby the offset current generating means 400 operates inversely with respect to the current amplifiers 500.

The current-to-voltage converters 600 may also be realised by means of current mirrors, for example, by mirroring the input current of the current-to-voltage converters 600 to a resistor so that the output voltage is obtained at the ends of this output resistor. In such an embodiment the gain of the circuit also depends on the ratio of the output resistors of the current-to-voltage converters 600 and the input resistors of the voltage-to-current converters 100. The ratio of the output and input resistors can be made accurate by forming the resistors of the same material and placing the resistors parallely in the circuit and near to each other so that the characteristics of the resistor material are as identical as possible in both resistors.

FIG. 2 shows a preferred embodiment of the invention. The structure of this embodiment aims at reducing differences caused by process variation between the produced integrated circuits comprising the system according to the invention, especially concerning the offset current and the common-mode voltage at the output. In the embodiment shown in FIG. 2 it is attempted to even out process variation by producing two reference current signals from a certain reference voltage by means of a circuit and resistor similar to those in the pre-stage voltage-to-current converters 100. Thus, process variation has almost the same effect on both the reference current signals generated from the reference voltage and signals converted in the pre-stage voltage-to-current converters 100 so that it is possible by means of the reference current signals to compensate at least partly for the effect of process variation. The reference voltage can be formed in many different ways known to a person skilled in the art, so it will not be described here in greater detail.

One of the reference current signals generated is directed to the offset current generating means 400. The reference current signal is used as constant current in the manner described above, the programmable current amplifier of the offset current generating means 400 amplifying said constant current to generate the offset current. The other one of the reference current signals is used to set the output stage common-mode voltage to the target value, again using the common mode feed forward (CMFF) technique.

In addition to a differential signal, the solution according to the invention can also be applied to single-ended signals. An example of such an embodiment is shown in FIG. 3, where the embodiment of FIG. 2 is applied to a single-ended signal. The operation of this embodiment is otherwise the same as described above but there is no common-mode rejection due to the single-endedness of the input signal. The average output voltage level of the output stage current-to-voltage converter can be set to a desired level by means of a reference current signal produced by a voltage-to-current converter 700.

FIG. 4 shows the structure of a programmable current amplifier 500 according to a preferred embodiment of the invention. The current amplifier's input signal is fed to the input IN and the output signal is obtained at the output OUT. Signal GAIN can be used to control the gain of the current amplifier. The current amplifier is implemented using scaled current mirrors. For clarity, FIG. 4 does not show transistors T3–T14, nor switches D3–D14. Switches D1–D16 are used to select one of the current mirror's transistors from transistors T1–T16 the dimensions of which are scaled to produce the desired current gain. In this example, the control signal GAIN is a 16-bit signal so that the desired gain is selected by setting the control bit corresponding to the desired signal to 'one'. In this embodiment, switch D1 and at the same time the corresponding line of the control signal GAIN selects the smallest gain and switch D16 the greatest gain.

The current mirror's current gain is determined according to the ratios of the channel dimensions of the current mirror's transistors. The ratio of the width W and length L of the channel of the current mirror's first transistor T0, connected so as to operate as a diode, is W/L. The dimensions of mirror transistor T1 are in this embodiment the same so that selecting transistor TI makes the amplifier's gain 0 dB. The dimensions of transistor T2 are 1. 19W/L whereby the gain is $$\frac{1.19W/L}{W/L} = 1.19 = 1.5dB.$$

In this embodiment, the gain values are in steps of 1.5 dB, so the channel areas of transistors T1–T16 grow from transistor to transistor by a coefficient of 1.19. Then the dimensions of transistor T15 are approximately 11.2 W/L, corresponding to a gain of 21 dB, approximately, and the dimensions of transistor T16 about 13.3 W/L, corresponding to a gain of 22.5 dB, approximately.

FIG. 5 shows the structure of an offset current generating means 400 according to a preferred embodiment of the invention. A certain constant reference current is brought to the input IN and the offset current is obtained at the output OUT. Signal GAIN can be used to control the magnitude of the offset current. For clarity, FIG. 5 does not show transistors T3–T14, nor switches D3–D14. The operation of the structure depicted in FIG. 5 is substantially the same as that of the structure shown in FIG. 4 with the exception that the order of switches D1–D16 is opposite to the order of transistors T1–T16. In the structure shown in FIG. 5 the transistor dimensions are the same as in FIG. 4 so that the offset current generating means 400 amplifies the reference current at its input IN with the gain selected by switches D1–D16. In the structure depicted by FIG. 5 switch D16 and at the same time the corresponding line of the control signal GAIN selects the smallest gain and switch D1 the greatest gain.

The inverse control effect of the control signal GAIN in the offset current generating means 400 can be easily realised in the manner shown in FIGS. 4 and 5 by placing the switches D1–D16, controlling the current gain of the current mirror in the offset current generating means 400, in an order which is reverse to that of the corresponding switches in the programmable current amplifier 500.

The structures shown in FIGS. 4 and 5 are just examples of possible structures used in the amplifier circuit according to the invention. In the description of FIGS. 4 and 5 it is assumed that value "1" of a certain line of the control signal GAIN makes the corresponding switch to be closed and value "0" means the switch is open. In the amplifier structure according to the invention the coding of the control signal GAIN may also be the opposite or realised in some other way.

FIG. 6 shows by way of example a block diagram of an advantageous application for the amplifier circuit according to the invention, namely, that of a mobile communications device. The mobile communications device shown in FIG. 6 comprises blocks typical of a mobile communications device, including a microphone 61, keypad 62, display 63, earphone 64 and a control block 65 that controls the operation of the mobile communications device. The control block 65 is typically realised using a microprocessor. In addition, the mobile communications device according to FIG. 6 comprises a transmitter block 67, receiver block 68 and a duplexer block 70 for the antenna connection. The transmitter block 67 typically comprises an AID converter to convert the signal produced by the microphone to digital format, and functional blocks typical of a mobile communications application, such as a speech encoding block, channel encoding block, scrambling block and a modulation block. For clarity, these are not shown in FIG. 6. The control block 65 also controls the operation of the amplifier circuit 66 in connection with the mobile communications device. The control block 65 controls the operation of the amplifier circuit using the control signal GAIN e.g. in a manner described earlier in this application. The control signal GAIN is typically a digital signal comprising several control bits.

FIG. 7 shows an example of a method according to an advantageous embodiment of the invention. This method can be applied for example to any of the current amplifier circuits disclosed in this specification, or any other current amplifier circuit having a current amplifier stage and an offset current generating means, which offset current generating means essentially functions by amplifying a certain reference current. After the beginning 900, the state of a gain control signal is checked in step 910. If the gain control signal has not changed, any gains are not changed. If the gain control signal has changed in a way which increases the gain of the current amplifier circuit, the gain of the current amplifier stage is increased in step 920, and the amplification of the reference current is decreased 930 in the offset current generating means. If the gain control signal has changed in a way which decreases the gain of the current amplifier circuit, the gain of the current amplifier stage is decreased in step 940, and the amplification of the reference current is increased 950 in the offset current generating means. If the current amplifier stage is implemented by more than one selectable sub-stages, the amplification of the current amplifier stage is preferably adjusted by selecting the output of a sub-stage, whose amplification corresponds to the desired amplification. If the offset current generating means is implemented by amplifying a certain reference current with a current amplifier having more than one selectable substages, the amplification of the reference current is preferably adjusted by selecting the output of a sub-stage, whose amplification produces an amplified reference current corresponding to the desired reference current.

FIG. 8 shows an example of a method according to a further advantageous embodiment of the invention for amplifying a current signal according to a control signal. In the method, a reference current is generated in step 990. The reference current is amplified in step 991 according to the inverse of the control signal, i.e. when the control signal indicates large amplification, the reference current is amplified little, and when the control signal indicates a small amplification, the reference current is amplified strongly. Next, the amplified reference current is added in step 992 to the current signal to be amplified, after which the sum signal is amplified in step 993. The amplified sum signal is then outputted as the amplified current signal in step 994. Preferably, the amplifications are performed with adjustable current amplifier stages, which preferably comprise selectable sub-stages as described previously in connection with other embodiments of the invention. Although the method is for clarity described as successive steps in the example of FIG. 8, it is evident for a man skilled in the art that in an analogue current amplifier circuit the described operations are performed on an essentially continuous basis.

The embodiments described above are presented by way of example only, and it is obvious to one skilled in the art that the functional blocks described here can be realised and combined in many different ways. It is also obvious to one skilled in the art that the voltage-to-current converters 100 included in the exemplary embodiments disclosed above can be omitted if in the application of the invention the output signal of the block preceding the amplifier circuit according to the invention is in the current mode. Similarly, the current-to-voltage converters 600 can be omitted if the input signal of the block following the amplifier circuit is in the current form.

For example, the structure according to the invention can in principle be realised using purely digital integrated circuit technology which includes no accurate analog components and which is cheaper than analog integrated circuit technology. This, however, requires an external resistor for the voltage-to-current conversion or voltage-to-current conversion realised in some other way and possibly a calibrating function.

The solution according to the invention saves the silicon area needed because the number of required passive, space-occupying components, such as resistors, is very small. An amplifier realised by means of current mirrors can be implemented in an extremely small space using modern semiconductor processes. In implementations of analog functions the significance of silicon area savings is continually emphasised since the silicon area required by analog functions does not necessarily diminish along with the line width of digital integrated circuit technology, due to the need for passive components, for example. Therefore, the silicon area savings achieved by means of the invention is a significant advantage.

In addition, the solution according to the invention makes it possible to achieve a low noise level, thanks to the small number of resistors.

The dynamic range of the amplifier according to the invention is not limited to low operating voltages because the signal processed is in the current mode, whereby the gain range achieved is also broad. For the same reason, the amplifier circuit according to the invention operates also at very low operating voltages.

The solution according to the invention also makes it possible to reduce the current consumption of the amplifier since the offset current decreases as gain increases, thus avoiding extra current consumption caused by an unnecessarily large offset current.

The current amplifier structure according to the invention can be realised using digital processes which are cheaper than analog ones and do not have linear resistors available. So, the current amplifier structure according to the invention is also suitable to be implemented by means of a CMOS process.

Above the invention was described with reference to its preferred embodiments but it is obvious that the invention can be modified in many different ways in accordance with the inventional idea defined by the claims set forth below.

What is claimed is:

1. A programmable integrated amplifier circuit comprising at least one programmable current amplifier wherein the gain of said at least one programmable current amplifier is determined on the basis of the value of a certain control signal, and wherein said circuit further comprises:

offset current generating means for generating an offset current according to the value of said certain control signal in inverse proportion to the gain of said at least one programmable current amplifier;

summing means, arranged to add said offset current to a current signal, for forming an input to said at least one programmable current amplifier; and means, responsive to a change in said certain control signal which causes the gain of said at least one programmable current amplifier to increase, for causing the offset current generated by the offset current generating means to decrease, and responsive to a change in said certain control signal which causes the gain of said at least one programmable current amplifier to decrease, for causing the offset current generated by the offset current generating means to increase.

2. The amplifier circuit of claim 1, wherein said offset current generating means comprises a second programmable current amplifier which is arranged to generate an offset current by amplifying a certain substantially constant reference current.

3. The amplifier circuit of claim 2, wherein the structure of said programmable current amplifier comprised in said offset current generating means comprises current mirror constructions.

4. The amplifier circuit of claim 1, wherein said programmable current amplifiers comprise current mirror constructions.

5. The amplifier circuit of claim 2, further comprising reference current generating means for generating said certain substantially constant reference current on the basis of a certain reference voltage.

6. The amplifier circuit of claim 1, further comprising at least one voltage-to-current converter to convert a voltage-mode input signal into a current-mode signal for the at least one programmable current amplifier, said at least one voltage-to-current converter being arranged to produce at least part of the gain of the amplifier circuit.

7. A method for regulating the gain of a current amplifier circuit having at least one programmable current amplifier and a means for generating an offset current by amplifying a certain reference current, comprising the steps of:

when the gain of the current amplifier circuit is increased, increasing the gain of the at least one programmable current amplifier, and decreasing the amplification of the reference current in the means for generating an offset current; and when the gain of the current amplifier circuit is decreased, decreasing the gain of the at least one programmable current amplifier, and increasing the amplification of the reference current in the means for generating an offset current.

8. A method according to claim 7, wherein said current amplifier circuit has at least one programmable current amplifier implemented by means of at least two selectable amplifier stages, and at least one means generating an offset current by amplifying a certain reference current implemented by means of at least two selectable amplifier stages, and further comprising the steps of:

controlling the at least one programmable current amplifier and the at least one offset current generating means, each implemented by means of at least two selectable amplifier stages, by the values of a common control signal, and selecting by means of said control signal, from the selectable amplifier stages of the programmable current amplifier, the stage that produces the desired gain, and from the selectable amplifier stages of the offset current generating means, the stage that produces the desired reference current gain, and performing said selecting from the selectable amplifier stages of the programmable current amplifier and the selectable amplifier stages of the offset current generating means in an inverse manner such that:

a control signal value that selects the programmable current amplifier's selectable amplifier stage which produces the greatest gain, selects the offset current generating means' selectable amplifier stage which produces the smallest gain and at the same time the smallest offset current, and a control signal value that selects the programmable current amplifier's selectable amplifier stage which produces the smallest gain, selects the offset current generating means' selectable amplifier stage which produces the greatest gain and at the same time the greatest offset current.

9. A method according to claim 8, wherein scaled current mirror transistors are used as the selectable amplifier stages.

10. A programmable integrated amplifier circuit having a first programmable current amplifier for producing an amplified output signal, derived from a current signal, with an adjustable gain, the gain being dependent on the value of a control signal, comprising:

an offset current generating means for generating an offset current, a summing means for adding said offset current to the current signal for forming an input to said first programmable current amplifier to produce said amplified output signal, and a second programmable current amplifier in said offset current generating means for generating said offset current by amplifying a reference current with an adjustable gain, said gain of said second programmable current amplifier being inversely dependent on the value of the control signal.

11. A method for amplifying an output signal derived from a current signal according to a control signal, comprising the steps of:

generating a reference current, amplifying said reference current according to the inverse of the control signal to produce an offset current, adding said offset current to the current signal to produce a sum signal, and amplifying said sum signal according to the control signal for producing the amplified output signal.

12. The amplifier circuit of claim 1, further comprising:

means for coupling the amplifier circuit to a control means of a mobile communications device which generates said certain control signal for regulating the gain of the amplifier circuit;

means for coupling the input of said amplifier circuit to the output of a microphone of said mobile communications device to amplify the output signal of the microphone; and means for coupling the output of said amplifier circuit to the input of a transmitter of said mobile communications device to transmit the amplified output signal of the microphone from said mobile communications device.

13. The amplifier circuit of claim 6, further comprising a reference current generating means for generating said certain substantially constant reference current on the basis of a certain reference voltage, and substantially comprising the structure of said at least one voltage-to-current converter.

* * * * *